United States Patent [19]

Schmitt

[11] Patent Number: 4,654,527
[45] Date of Patent: Mar. 31, 1987

[54] REFERENCE MARK IDENTIFICATION SYSTEM FOR MEASURING INSTRUMENT

[75] Inventor: Walter Schmitt, Traunreut, Fed. Rep. of Germany

[73] Assignee: Dr. Johannes Heidenhain GmbH, Traunreut, Fed. Rep. of Germany

[21] Appl. No.: 584,729

[22] Filed: Feb. 29, 1984

[30] Foreign Application Priority Data

Mar. 12, 1983 [DE] Fed. Rep. of Germany ....... 3308814

[51] Int. Cl.$^4$ .............................................. H01J 3/14
[52] U.S. Cl. ............................ 250/237 G; 33/125 C
[58] Field of Search ........ 250/231 R, 231 SE, 237 G; 356/395; 340/347 P; 364/560, 561, 562; 33/125 C

[56] References Cited

U.S. PATENT DOCUMENTS

| | | | |
|---|---|---|---|
| 4,403,859 | 9/1983 | Ernst | 250/237 G |
| 4,491,928 | 1/1985 | Reichl | 364/562 |
| 4,492,861 | 1/1985 | Kebschull et al. | 250/237 G |
| 4,519,140 | 5/1985 | Schmitt | 33/125 C |

Primary Examiner—David C. Nelms
Attorney, Agent, or Firm—Willian Brinks Olds Hofer Gilson & Lione Ltd.

[57] ABSTRACT

A measuring system is described which includes a scale which defines a measuring graduation and an array of reference marks. The reference marks are positioned at predetermined absolute positions with respect to the graduation and are used to generate reproduceable electric reference control pulses. In order to identify each of the reference marks a serially allocated code mark is provided which is made up of at least one nonzero code mark segment. Each nonzero code mark segment agrees in spatial pattern with the nonzero associated reference mark in the measuring direction. In order to distinguish nonzero code mark segments from reference marks, the width of the nonzero code mark segments perpendicular to the measuring direction is made less than the width of the reference marks.

10 Claims, 6 Drawing Figures

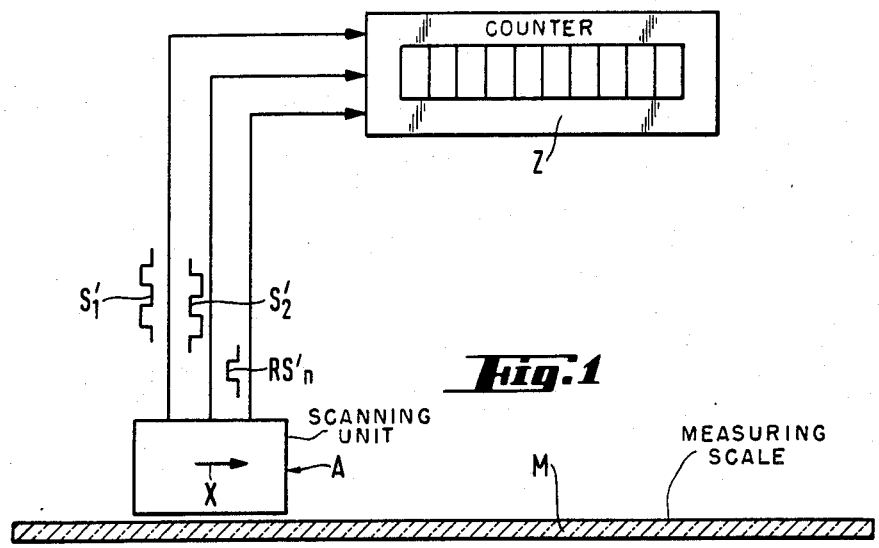
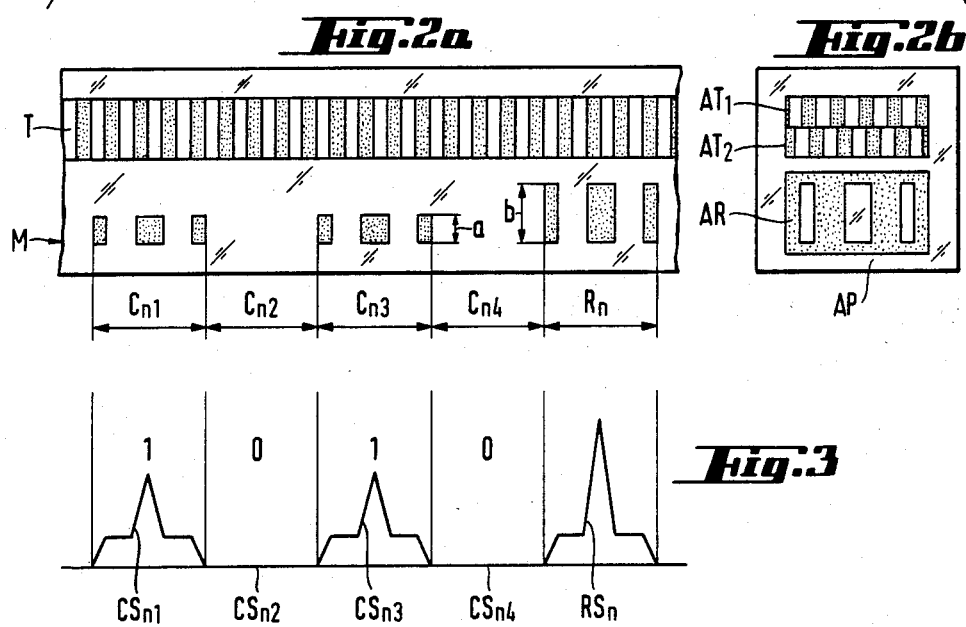

REFERENCE MARK IDENTIFICATION SYSTEM FOR MEASURING INSTRUMENT

BACKGROUND OF THE INVENTION

The present invention relates to a reference mark identification system for use with a measuring system of the type which includes a measuring scale extending along a measuring direction, a measuring graduation defined by the scale, a plurality of reference marks, all of which define a single, preselected pattern along the measuring direction and each of which is positioned at a predetermined absolute position with respect to the graduation, and means for scanning the reference marks to generate reference pulses in response thereto.

In such a measuring system, reference control pulses generated at the reference marks can be used in various ways. For example, such reference pulses can be used to set the counter of the measuring system to zero in order to define a zero position of the measuring system. Alternately, such reference control pulses can be used to load a predetermined position value into the counter and to start the measuring process. Furthermore, such reference pulses can be used to control interference pulses as well as to act on a control arrangement coupled to the counter.

German Patent DE-PS 24 16 212 discloses an incremental length or angle measuring system in which a scale defines an incremental graduation and a plurality of reference marks on a separate track alongside the incremental graduation. The absolute values of these reference marks are determined from the different spacings between the individual reference marks. The spacings between the reference marks are determined by scanning the incremental graduation. Therefore, if the absolute position of any single reference mark is to be determined, two reference marks must be scanned. This process is relatively complicated and time consuming if for example two such reference marks lie far apart. Furthermore, in the event of a faulty or erroneous counting of the increments between two reference marks, the separation between the two reference marks can be measured inaccurately, and this can lead to false identification of the reference marks.

In German Patent DE-PS 29 52 106 there is described an incremental length or angle measuring system which includes a scale that defines both a measuring graduation and a plurality of reference marks situated alongside the graduation. In this system each of the reference marks is characterized by a unique line group distribution, different from all the other reference marks. The individual reference marks are scanned by scanning fields in a scanning unit and each reference mark has a particular scanning field allocated to it which defines the same line group distribution as the associated reference mark. This arrangement is relatively expensive, since the line group distributions of the individual reference marks should be distinguished from one another as strongly as possible in order to make possible an unambiguous identification of the individual reference marks. Furthermore, the scanning unit must include an identical scanning field for each of the reference marks to be identified.

German DE-OS No. 30 39 483 describes an incremental length or angle measuring system which defines a graduation track and a reference mark track arranged alongside the graduation track. A code mark track is arranged parallel to the graduation track and it includes code marks which identify respective ones of the reference marks. For the scanning of the reference marks and of the associated code marks, separate scanning fields on a scanning plate of a scanning unit are provided. Thus, the segments of the code marks are scanned by scanning fields which are provided particularly for these code mark segments and are different from the scanning fields used to scan the reference marks.

BACKGROUND OF THE INVENTION

The present invention is directed to an improved measuring system of the general type described initially above, in which the scanning of reference marks and associated code mark segments is substantially simplified.

According to this invention, a measuring system of the type described initially above is provided with a plurality of code marks, each positioned between two adjacent ones of the reference marks and each serially associated with a respective one of the reference marks. Each of the code marks comprises at least one nonzero code mark segment which defines a spatial pattern along the measuring direction which is identical to that of the reference marks.

The important advantages of this invention come from the fact that only a single scanning field is required on the scanning plate of the scanning unit to scan both the reference marks and the associated code mark segments. This is because both the reference marks and the nonzero code mark segments have the same spatial pattern, at least in the measuring direction. Because of the structural agreement between the nonzero code mark segments and the reference marks, the manufacture of both the measuring scale and the scanning plate are considerably simplified. For this reason a particularly economical measuring system results. Further advantageous features of the invention are set forth in the attached dependent claims.

The invention itself, together with further objects and attendant advantages, will best be understood by reference to the following detailed description, taken in conjunction with the accompanying drawings.

BRIEF DESCRIPTION OF THE DRAWINGS

FIG. 1 is a schematic representation of an incremental length measuring system which incorporates a presently preferred embodiment of this invention.

FIGS. 2, 2A and 2B are a plan views of a portion of the measuring scale and the scanning plate of the length measuring system of FIG. 1.

FIG. 3 is a signal diagram of reference and code mark signals generated in scanning the scale of FIG. 2.

DETAILED DESCRIPTION OF THE PRESENTLY PREFERRED EMBODIMENTS

Figure 4:
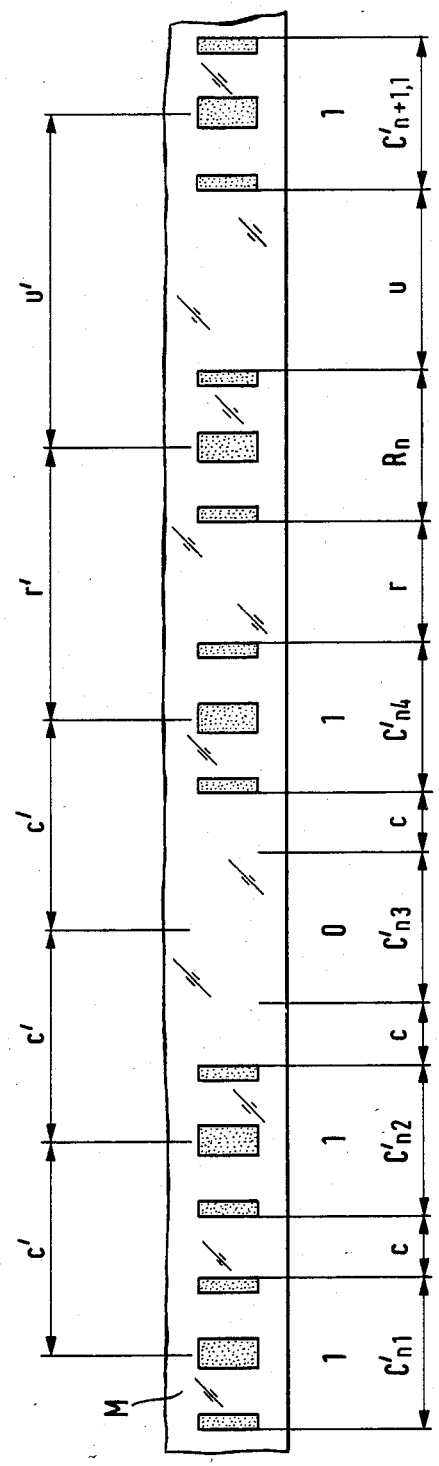
FIG. 4 is a plan view of a portion of the scale of FIG. 2.

Turning now to the drawings, FIG. 1 shows a schematic view of a photoelectric incremental length measuring system that includes a measuring scale M and a scanning unit A. The scale M and the scanning unit A are connected in each case (in a manner not shown) with objects, the position of which is to be measured. These objects may comprise for example the slide piece and bed of a processing machine. The scale M serves as a carrier for an incremental graduation T which takes the form of a line grid as shown in FIG. 2. This incremental graduation T is scanned in direct lumination, photoelectrically without physical contact by the scanning unit A. A series of reference marks $R_n$ (n=1, 2, 3, . . .) is provided on the scale M alongside of the graduation T. Each of the reference marks $R_n$ is identical to the others and each defines an identical line group with a predetermined line distribution or spatial pattern along the measuring direction. The measuring direction is indicated by the arrow labeled X in FIG. 1. The scanning unit operates to generate periodic scanning signals $S_1$, $S_2$ during the scanning of the graduation T. These scanning signals are amplified in the scanning unit A and transformed into square wave signals $S_1'$, $S_2'$ which are applied to an electronic counter Z. The counter Z operates to count the period of the square wave signals $S_1'$, $S_2'$ and to display a measurement value in digital form. The square wave signals $S_1'$, $S_2'$ are phase-shifted with respect to one another by a quarter of the grid constant (division period) of the graduation T in order to allow accurate discrimination of the scanning direction. The scanning unit A also operates to generate reference signals $RS_n$ in response to the scanning of the reference marks $R_n$. The reference signals $RS_n$ are amplified in the scanning unit A, converted into square wave signals $RS_n'$, and applied as inputs to the counter Z.

The reference signals $RS_n$ can be used to trigger various functions in the counter Z. For example, in response to the reference signals $RS_n$ an incremental measuring system can be made into a quasiabsolute measuring system if to each reference mark $R_n$ there is allocated a number which represents its absolute position with respect to an invariable zero point. Furthermore, a predetermined one of the reference marks $R_n$ can be used to set the counter Z to the value zero upon the generation of the reference signal $RS_n$ obtained from that reference mark $R_n$. Such functions are only possible however if the selected one of the reference mars $R_n$ can be clearly identified and distinguished from the other reference marks $R_n$.

In order to allow such identification of each individual reference mark $R_n$, a code mark $C_n$ is serially allocated to each of the reference marks $R_n$. Each of the code marks $C_n$ is made up of at least one code mark segment $C_{nm}$ (n, m=1, 2, 3, . . .). Each of the nonzero code mark segments $C_{nm}$ defines the same preselected spatial pattern as that of the reference marks $R_n$, at least in the measuring direction.

As shown in FIG. 2, the code mark segments $C_{nm}$ between the individual identical reference marks $R_n$ are serially allocated to the reference marks $R_n$ on the scale M. That is, the code mark segments are positioned such that the scanning system included in the scanning unit A for the scanning the reference marks $R_n$ also scans the code mark segments $C_{nm}$. Of the entire series of reference marks $R_n$ only one reference mark $R_n$ is shown in FIG. 2. As shown in FIG. 2, four code mark segments $C_{n1}$-$C_{n4}$ are associated with the reference mark $R_n$. In order to allow the code mark segments $C_{n1}$-$C_{n4}$ to be distinguished from the reference mark $R_n$, the width a of the code mark segments $C_{n1}$-$C_{n4}$ measured perpendicularly to the measuring direction X is less than the width b of the reference mark $R_n$. In the embodiment of FIG. 1 a=b/2.

The scanning unit A included in the measuring system for scanning the scale M includes a scanning plate AP as shown in FIG. 2. This scanning plate AP defines two scanning fields $AT_1$, $AT_2$ which are offset with respect to one another by a quarter of the grid constant of the graduation T. Each of these scanning fields $AT_1$, $AT_2$ is identical with the graduation T, and photosensors (not shown) are aligned with the scanning fields $AT_1$, $AT_2$ to scan the graduation T and to generate in response thereto the scanning signals $S_1$, $S_2$. In addition, for the scanning of the reference marks $R_n$ and of the code mark segments $C_{n1}$-$C_{n4}$ there is provided on the scanning plate AP a scanning field AR. A single photosensor (not shown) is aligned with the scanning field AR in order to generate both the reference signals $RS_n$ and the code signals $CS_{n1}$-$CS_{n4}$. The spatial pattern of the scanning field AR is identical with the spatial pattern of the reference marks $R_n$ and of the nonzero code mark segments $C_{nm}$. When the code mark segments $C_{n1}$-$C_{n4}$ are scanned in the scanning of the scale M from left to right, the corresponding code signals $CS_{n1}$-$CS_{n4}$ shown in FIG. 3 are generated. These code signals $CS_{n1}$-$CS_{n4}$ in the example of FIG. 3 define the binary signal "1010". This is because the nonzero code mark segments $C_{n1}$, $C_{n3}$ are characterized by the presence of a spatial pattern identical to that of the reference marks $R_n$, while the zero code mark segments $C_{n2}$, $C_{n4}$ are characterized by the absence of such a pattern. This binary signal 1010 clearly identify the associated reference mark $R_n$. Since the width b of the reference mark $R_n$ is twice as great as the width a of the code mark segments $C_{n1}$-$C_{n4}$, the code signals $CS_{n1}$-$CS_{n4}$ can be clearly distinguished from the reference signals $RS_n$ by reason of the different signal amplitudes. Of course, the ratio between the widths a and b can be chosen arbitrarily as necessary to provide the desired level of discrimination.

The code signals $CS_{n1}$-$CS_{n4}$ are applied to an evaluating circuit included in the counter Z to permit absolute identification of the associated reference mark $R_n$. If the scanning unit A scans the scale M in a positive measuring direction from left to right, then the next code mark segments $C_{n1, m}$ follow after the reference mark $R_n$ and thereafter follows the associated reference mark $R_{n+1}$, and so forth. In order in this scanning direction to be able to recognize the first code mark segment $C_{n+1, 1}$, the code mark segment $C_{n+1, 1}$ should have for example the binary value "1". As a general matter, the code mark segments $C_{nm}$ can include beginning of code mark and end of code mark information items. With the recognition of the beginning of code mark information, the evaluation circuit in the counter Z can be prepared that thereupon code information is to be read out following the beginning of code mark information. The end of code mark information serves to assure that the entire code information has been read out. In this way, a possible reversal of the measuring direction in the middle of the scanning of code information can be recognized.

When the scanning unit A is moved in a positive measuring direction from left to right the code information of the code mark segments $C_{nm}$ is scanned before the associated reference mark $R_n$ is scanned. In the scanning movement in a negative measuring direction from right to left, by means of the direction-dependent evaluation of the code information can be recognized that after the code mark segments $C_{n+1, m}$ there must follow the reference mark $R_n$.

The code mark segments $C_{nm}$ and the associated reference marks $R_n$ can follow upon one another without gaps therebetween, or alternately a predetermined spacing can be provided between them. The gapless arrangement is preferred if there is only limited space available between individual reference marks $R_n$. Preferably, the code mark segments $C_{nm}$ and the reference marks $R_n$ are applied as a whole-numbered fraction or a whole numbered multiple of the graduation (division) period of the incremental graduation T on the scale M, so that the scanning of the code mark segments $C_{nm}$ and the reference marks $R_n$ occurs in the rhythm of the scanning of the incremental graduation T.

FIG. 4 shows an enlarged fragmentary view of portions of the scale M of FIG. 2. As shown in FIG. 4, a reference mark $R_n$ as well as the associated code mark segments $C'_{n1}$–$C'_{n4}$ and the first code mark segment $C'_{n+1,1}$ of the reference mark $R_{n+1}$ (not shown) are arranged serially in sequence along the length of the scale M. The reference mark $R_{n+1}$ (not shown) would follow the reference mark $R_n$ in the positive measuring direction X. Each of the nonzero code mark segments $C'_{n1}$–$C'_{n4}$ and $C'_{n+1,1}$–$C'_{n+1,4}$ are completely identical to the reference mark $R_n$ and are scanned by the scanning field AR of the scanning plate AP as shown in FIG. 2.

In order to distinguish the reference mark $R_n$ from the associated code mark segments $C'_{n1}$–$C'_{n4}$, the spacing r between the reference mark $R_n$ and the adjacent code mark segment $C'_{n4}$ differs from the spacing c between adjacent individual ones of the code mark segments $C'_{n1}$–$C'_{n4}$. In order to distinguish the reference mark $R_n$ from the non-associated adjacent code mark segment $C'_{n+1,1}$, the spacing between the reference mark $R_n$ and the code mark segment $C'_{n+1,1}$ is equal to the value u, which is different from the spacings c and r. In the example of FIG. 4, the code signals $CS'_{n1}$–$CS'_{n4}$ yield the binary signal "1101". In order to distinguish the reference marks $R_n$ from the code mark segments $C'_{n1}$–$C'_{n4}$ and $C'_{n+1,1}$ the corresponding spacings c, r, u' between the centers of gravity or centers of the reference marks $R_n$ and code mark segments $C'_{nm}$ can be used instead of the spacings c, r, u. The reference marks $R_n$ and code mark segments $c'_{nm}$ as well as the spacings c, r, u, c', r', u' in the measuring direction X again are preferably formed as whole-number parts and/or whole number multiples of the division or graduation period of the incremental graduation T on the scale M. The code signals $CS_{nm}$ as well as the spacings c, r, u, c', r', u' are evaluated in the evaluating arrangement of the counter Z. This evaluating arrangement can include a selected circuit which operates to select certain ones of the reference marks $R_n$ to be brought into operation from the total series of reference marks $R_n$.

Of course, it should be understood that a wide range of changes and modifications can be made to the preferred embodiments described above. It is therefore intended that the foregoing detailed description be regarded as illustrative rather than limiting, and that it be understood that it is the following claims, including all equivalents, which are intended to define the scope of this invention.

I claim:

1. In a measuring apparatus of the type comprising a measuring scale extending along a measuring direction; a measuring graduation defined by the scale; a plurality of reference marks, every one of which defines a single, preselected spatial pattern along the measuring direction and each of which is positioned at a predetermined absolute position with respect to the graduation; means for scanning the reference marks to generate reference pulses in response thereto; and a counter responsive to the reference pulses; the improvement comprising:

a plurality of code marks, each positioned between two adjacent ones of the reference marks and each serially associated with a respective one of the reference marks, each of the code marks comprising at least one nonzero code mark segment, and each of the nonzero code mark segments defining the preselected spatial pattern along the measuring direction.

2. The invention of claim 1 wherein the means for scanning the reference marks comprises a scanning plate which defines a single scanning field for scanning both the reference marks and the nonzero code mark segments.

3. The invention of claim 1 wherein the reference marks define a first dimension perpendicular to the measuring direction, wherein the nonzero code mark segments define a second dimension perpendicular to the measuring direction, and wherein the first dimension is greater than the second dimension to distinguish the reference marks from the nonzero code mark segments.

4. The invention of claim 1 wherein the spacing between each of the reference marks and the adjacent one of the code mark segments of the associated one of the code marks is equal to r, wherein the spacing between adjacent code mark segments is equal to c, and wherein r differs from c to distinguish the reference marks from the code mark segments.

5. The invention of claim 1 wherein the spacing between each of the reference marks and the adjacent one of the code mark segments of the associated one of the adjacent code marks is equal to r, wherein the spacing between each of the reference marks and the adjacent one of the code mark segments of the nonassociated one of the adjacent code marks is equal to u; and wherein r differs from u to distinguish the associated one of the adjacent code marks from the nonassociated one of the adjacent code marks.

6. The invention of claim 1 wherein the code mark segments of each of the code marks encode both identification information identifying the associated reference mark and completion information indentifying the completeness of the code mark.

7. The invention of claim 1 wherein the measuring graduation defines a division period and wherein the code mark segments, the reference marks, and the spacings therebetween in the measuring direction are whole number fractions of the division period.

8. The invention of claim 1 wherein the measuring graduation defines a division period and wherein the code mark segments, the reference marks, and the spacings therebetween in the measuring direction are whole number multiples of the division period.

9. In a measuring apparatus of the type comprising a measuring scale extending along a measuring direction; a measuring graduation defined by the scale; a plurality of reference marks, every one of which defines a single, preselected spatial pattern and each of which is positioned at a predetermined absolute position with respect to the graduation; means for scanning the reference marks to generate reference pulses in response thereto; and a counter responsive to the reference pulses; the improvement comprising:

a plurality of code marks, each code mark positioned along the measuring direction adjacent an associated reference mark, each code mark comprising a plurality of code mark segments positioned adjacent one another, each code mark segment defining one of (1) a zero state; and (2) a non-zero state, each non-zero code mark segment defining the preselected spatial pattern;

means for determining which one of the two adjacent reference marks is associated with a code mark based upon (1) the preselected spacing between each code mark segment of each code mark; and (2) the preselected spacing between the reference mark adjacent the code mark in the direction opposite the measuring direction and the reference mark adjacent the code mark in the measuring direction.

10. The invention of claim 9 wherein the code mark segments of each of the code marks encode information identifying the beginning of the code mark information; identification information identifying the associated reference mark; and information identifying the end of the code mark.

* * * * *

UNITED STATES PATENT AND TRADEMARK OFFICE
CERTIFICATE OF CORRECTION

PATENT NO. : 4,654,527
DATED : March 31, 1987
INVENTOR(S) : Walter Schmitt

It is certified that error appears in the above-identified patent and that said Letters Patent is hereby corrected as shown below:

IN THE DETAILED DESCRIPTION OF
THE PRESENTLY PREFERRED EMBODIMENTS

In column 3, line 39, please delete "mars" and substitute therefor --marks--;

In column 3, line 55, please insert the word --of-- after the word "scanning";

In column 5, line 38, please delete "c, r, u'" and substitute therefor --c', r', u'--;

In column 5, line 49, please delete "selected" and substitute therefor --selecting--.

IN THE CLAIMS

In Claim 6 (column 6, line 44, please delete "indentifying" and substitute therefor --identifying--.

Signed and Sealed this

Tenth Day of May, 1988

*Attest:*

DONALD J. QUIGG

*Attesting Officer*  *Commissioner of Patents and Trademarks*